United States Patent

Lee

[11] Patent Number: 5,825,684
[45] Date of Patent: Oct. 20, 1998

[54] SRAM CELL STRUCTURE

[75] Inventor: Hsiao-Lun Bob Lee, Sunnyvale, Calif.

[73] Assignee: Chartered Semiconductor Manufactuing, Ltd., Singapore, Singapore

[21] Appl. No.: 929,952

[22] Filed: Sep. 15, 1997

Related U.S. Application Data

[62] Division of Ser. No. 663,579, Jun. 13, 1996, Pat. No. 5,700,707.

[51] Int. Cl.$^6$ .................................................. G11C 7/00
[52] U.S. Cl. ............................ 365/154; 365/149; 365/174
[58] Field of Search .................................. 365/154, 149, 365/174, 188

[56] References Cited

U.S. PATENT DOCUMENTS

| | | | |
|---|---|---|---|
| 4,532,609 | 7/1985 | Iizuka | 365/154 |
| 4,805,147 | 2/1989 | Yamanaka et al. | 365/154 |
| 4,926,378 | 5/1990 | Uchida et al. | 365/154 |
| 4,933,739 | 6/1990 | Harari | 357/55 |
| 5,051,951 | 9/1991 | Maly et al. | 365/154 |
| 5,198,706 | 3/1993 | Papaliolios | 307/465 |
| 5,330,927 | 7/1994 | Lee | 437/52 |
| 5,376,814 | 12/1994 | Lee | 257/334 |
| 5,377,139 | 12/1994 | Lage et al. | 365/154 |

*Primary Examiner*—Vu A. Le
*Attorney, Agent, or Firm*—George O. Saile; Stephen B. Ackerman; Graham S. Jones, II

[57] ABSTRACT

An SRAM transistor cell on a doped semiconductor substrate comprises two access FET transistors and two storage FET transistors. A first load capacitor has a plate connected to a first node with the other plate connected to the power supply. A second load capacitor has a plate connected to the second node with the other plate connected to the power supply, a bit line and a bit line bar. The first storage transistor drain connects to the first node. The second storage transistor drain connects to the second node. The storage transistors have interconnected sources. The first node connects via a first interconnection line to the second transistor gate. The second node connects via a second interconnection line to the first transistor gate. First and second access transistor gates connect to a wordline. The first access transistor drain connects to the first node. The second access transistor drain connects to the second node. The first access transistor source connects to the bit line. The second access transistor source connects to the bit line bar.

15 Claims, 12 Drawing Sheets

SRAM CELL STRUCTURE

This is a division of patent application Ser. No. 08/663,579, filing date Jun. 13, 1996 U.S. Pat. No. 5,700,707. An Sram Cell Structure And Method Of Manufacture Thereof, assigned to the same assignee as the present invention.

BACKGROUND OF THE INVENTION

1. Field of the Invention

This invention relates to Static Random Access Memory (SRAM) devices and more particularly to SRAM devices with small cell size, reduced electrical contact resistance and improved current control.

2. Description of Related Art

Figure 4:
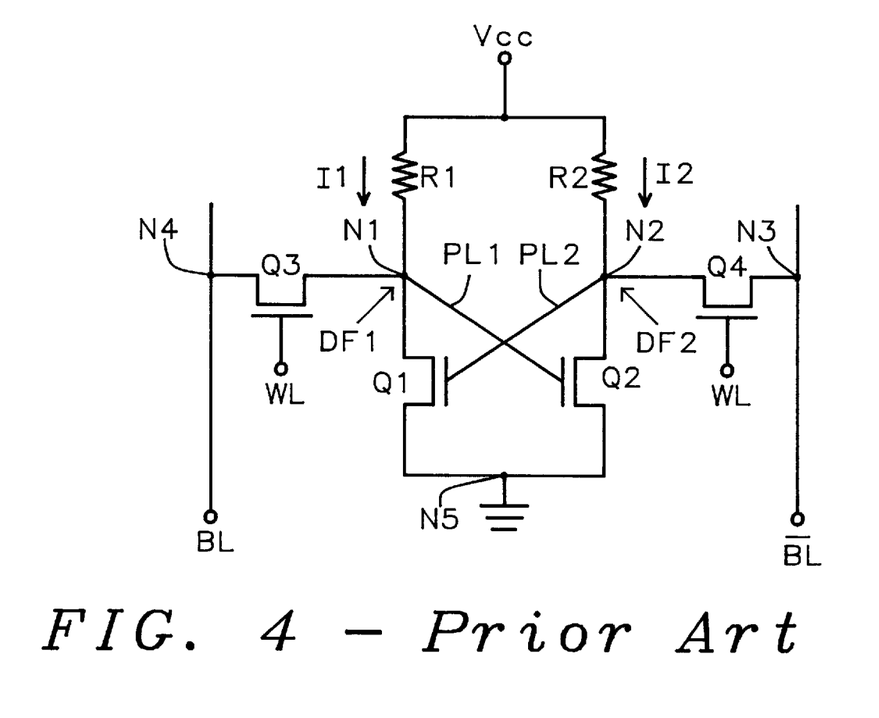
FIG. 4 shows a prior art four transistor SRAM cell with cross-coupled storage (driver) transistors, a pair of polysilicon load resistors and pass (access/transfer) transistors.

FIG. 4 shows a prior art four transistor SRAM cell with cross-coupled storage (driver) transistors Q1 and Q2, a pair of polysilicon load resistors R1, R2 and pass (access/transfer) transistors Q3 and Q4.

Load resistors R1 and R2 are connected between power supply voltage Vcc and nodes N1 and N2 respectively. A current $I_1$ flows from a terminal Vcc through a first load resistor R1 towards node N1. A second current $I_2$ flows from the terminal Vcc through a second load resistor R2 towards node N2.

Storage transistors Q1 and Q2 have their drain regions connected respectively to nodes N1 and N2 and their control gate electrodes cross-coupled respectively via lines PL1 and PL2 to nodes N2 and N1. The source regions of transistors Q1 and Q2 are connected via node N5 to ground, i.e. reference potential.

Node N1 is connected via a contact DF1 to the drain region of transistor Q1 and to the control gate electrode of transistor Q2. Load resistor R1 is connected between power supply voltage Vcc via node N1 and the contact DF1 to the drain of transistor Q1.

Node N2 is connected via a DF2 contact to the drain region of transistor Q2 and to the control gate electrode of transistor Q1. Load resistor R2 is connected between power supply voltage Vcc and via node N2 through the contact DF2 to the drain of transistor Q2.

Pass transistors Q3 and Q4 both have their control gate electrodes connected to the wordline WL.

Pass transistor Q3 has its control gate electrode connected to wordline WL and its source/drain (S/D) circuit connected between node N1 and and node N4, and is connected via node N4 to bit line BL.

Pass transistor Q4 has its control gate electrode connected to wordline WL and its S/D circuit connected between node N2 and node N3, and is connected via node N3 to bit line BL-bar.

Load resistors R1 and R2 have resistance values in the range of $10^7$ ohms to $10^{13}$ ohms which permits more substantial currents I1 and I2 in the range of microamperes ($10^{-6}$) to picoamperes ($10^{-12}$).

SUMMARY OF THE INVENTION

A method of forming an SRAM transistor cell on a doped semiconductor substrate includes the following steps. Form a first access transistor and a second access transistor, each having a source region, a drain region and a control gate electrode. Form a first storage transistor and a second storage transistor each having a source region, a drain region and a control gate electrode. Form a first node and a second node. Form a first load capacitor having one plate connected to the first node and the other plate thereof connected to the power supply connection. Form a second load capacitor having one plate connected to the second node and the other plate thereof connected to the power supply connection. Form a bit line and a bit line bar, first and second interconnection lines, the first storage transistor having the drain region thereof connected to the first node, the second storage transistor having the drain region thereof connected to the second node. The first and second storage transistors have the source regions thereof connected together. The first node is cross connected via the first interconnection line to the control gate electrode of the second transistor. The second node is cross connected via the second interconnection line to the control gate electrode of the first transistor. The control gate electrodes of the first and second access transistors connecting to a wordline.

Preferably the method includes the additional following steps. Connect the drain region of the first access transistor to the first node. Connect the drain region of the second access transistor to the second node. Connect the source region of the first access transistor to the bit line. Connect the source region of the second access transistor to the bit line bar. Connect the first node and the second node to first and second drain regions respectively of the first and second storage transistors in the substrate. Form at least one capacitor and connect at least one lower capacitor plate of the capacitor to at least one of the first and second drain regions. Cover the lower capacitor plate by a tunnel oxide layer, and cover the tunnel oxide layer with an upper capacitor plate.

Preferably, form the cell over a doped silicon body. Form a field oxide region on the doped silicon body. Form the lower capacitor plate of the capacitor partially above the field oxide region and partially in contact with a buried contact in the doped silicon body.

In another aspect of the invention, form the lower plate of the capacitor with an edge formed over the field oxide region. Form the tunnel oxide layer covering and extending across the edge. Form the upper plate of the capacitor above the tunnel oxide layer, the upper plate extending across the edge above the tunnel oxide layer. Form the lower capacitor plate partially above a field oxide region formed on doped silicon.

Preferably, form the lower plate of the capacitor with an edge formed over the field oxide region. Form the tunnel oxide layer covering the lower plate. Form the upper plate of the capacitors lying above the tunnel oxide layer. Form the lower plate of the capacitor with an edge formed over the field oxide region. Form the tunnel oxide layer covering a portion of the lower plate and extending across the edge. Form the upper plate of the capacitors lying above the tunnel oxide layer and extending across the edge. Form the capacitors forming on the interconnection lines.

In accordance with this invention, an SRAM transistor cell is formed on a doped semiconductor substrate. The first access transistor and a second access transistor, each have a source region, a drain region and a control gate electrode. A first storage transistor and a second storage transistor each have a source region, a drain region and a control gate electrode. A first load capacitor having one plate connected to a first node and the other plate thereof connected to the power supply connection. A second load capacitor has one plate connected to a second node and the other plate thereof connected to the power supply connection, plus a bit line and a bit line bar and first and second interconnection lines.

The first storage transistor has the drain region thereof connected to the first node. The second storage transistor has the drain region thereof connected to the second node. The first and second storage transistors have the source regions thereof connected together. The first node is cross connected via the first interconnection line to the control gate electrode of the second transistor. The second node is cross connected via the second interconnection line to the control gate electrode of the first transistor. The control gate electrodes of the first and second access transistors are connected to a wordline. The drain region of the first access transistor is connected to the first node. The drain region of the second access transistor is connected to the second node. The source region of the first access transistor is connected to the bit line. The source region of the second access transistor is connected to the bit line bar. The first and second nodes are connected to the drain regions respectively of the storage transistors in the substrate. The lower capacitor plates are connected to the drain regions respectively.

The cell is formed over doped silicon. A field oxide region is formed on the doped silicon. The lower capacitor plate is formed above the field oxide region, preferably partially above the field oxide region and partially in contact with the doped silicon, and the lower plate of the capacitor has an edge formed over the field oxide region. A tunnel oxide layer covers at least a portion of the lower plate, preferably including the edge of the lower plate. The tunnel oxide layer is covered by the upper capacitor plate which preferably extends across the edge.

In accordance with an aspect of this invention, the capacitor is formed on an interconnection line.

In accordance with another aspect of this invention a method is provided for forming a capacitor for an SRAM device by the following steps. Form a field oxide region in a doped semiconductor body. Form a lower capacitor plate partially above the field oxide region and partially in contact with a buried contact in the doped silicon body. Cover a portion of the lower capacitor plate with a tunnel oxide layer and form a gate oxide over the remainder of the lower capacitor plate.

The tunnel oxide layer is formed by a method selected from as follows:
a) forming the tunnel oxide layer above the lower plate, or
b) forming the tunnel oxide above the lower capacitor plate and over the edge thereof.

Then, form the upper capacitor plate of the capacitor above the field oxide region and the tunnel oxide layer.

Another aspect of this invention is a method of forming an SRAM transistor capacitor over a doped semiconductor body which includes the following steps. Form a field oxide region in a doped semiconductor body. Form a gate oxide layer over the body with a buried contact window therethrough adjacent to the field oxide region. Form a counter-doped buried contact region in the body below the buried contact window. Form a lower capacitor plate over the field oxide region extending into contact with the buried contact region. Preferably, the lower plate of the capacitor has an edge formed over the field oxide region. Form a dielectric layer over the lower capacitor plate including a tunnel oxide region within the dielectric layer. Form an upper capacitor plate above the tunnel oxide layer. Preferably, the tunnel oxide layer covers and extends across the edge.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figures 1A, 1B:
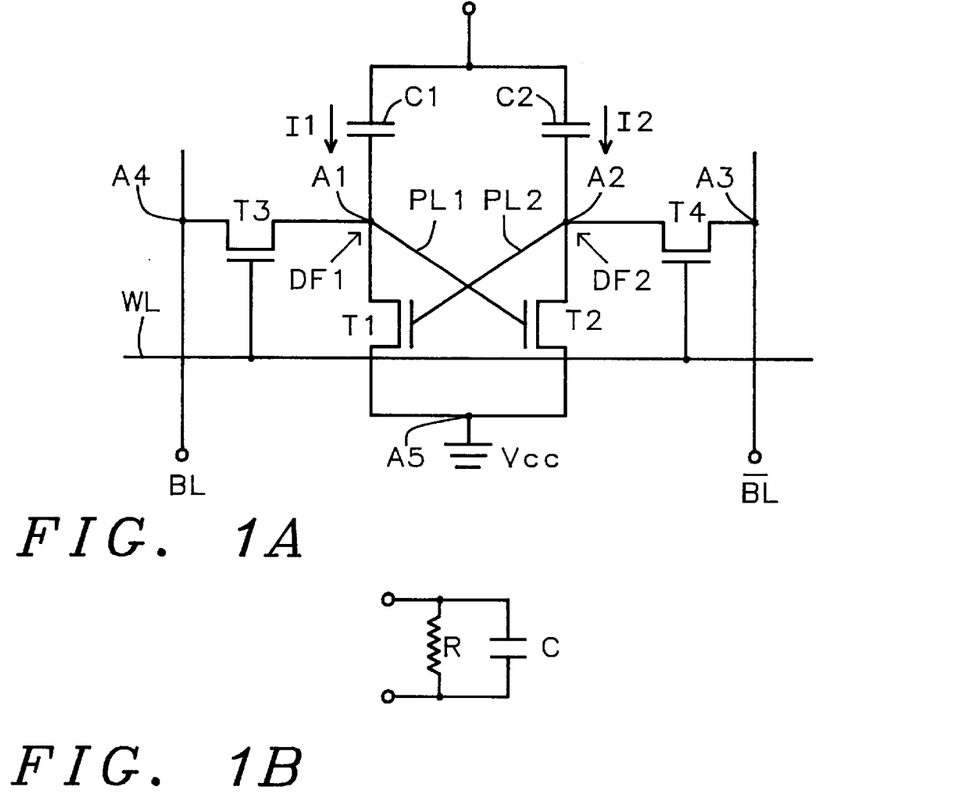
FIG. 1A shows an electrical schematic circuit diagram of an SRAM (Static Random Access Memory) implementation of this invention.
FIG. 1B shows the equivalent circuit for a pair of capacitors comprises a capacitor and a resistor which carries a leakage current through the resistor.

FIG. 1A shows an electrical schematic circuit diagram of an SRAM (Static Random Access Memory) implementation of this invention.

SRAM Circuit

Figure 2:
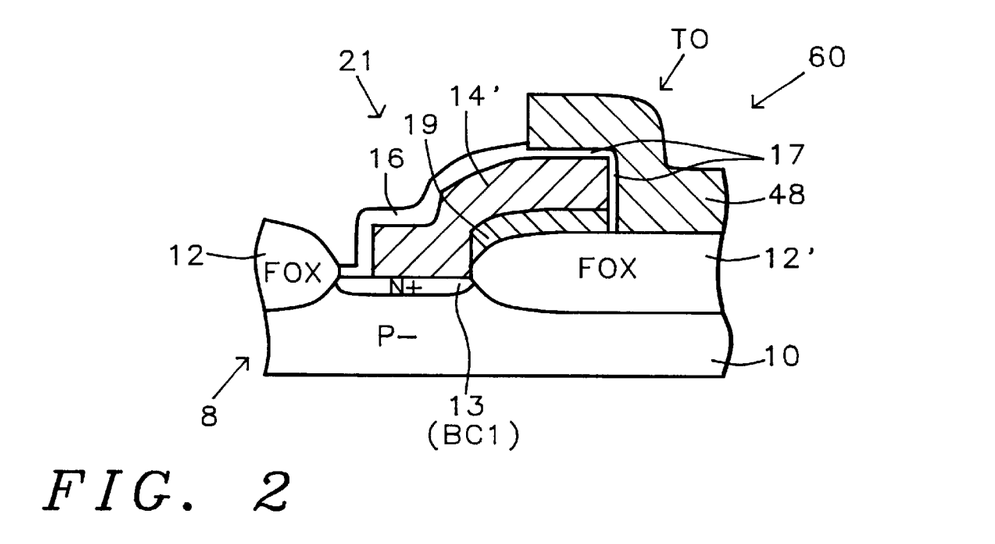
FIG. 2 shows a sectional view of a portion of an SRAM device in accordance with FIGS. 1A and 1B taken along line 2—2' in FIG. 3.

FIG. 1A shows a four transistor SRAM cell, which is a modified four transistor cell, in accordance with this invention in which the conventional load resistors have been replaced by integrated circuit capacitors formed by lower plate 21 (lower layer 19/contact layer 14 FIG. 2) and upper plate 48 separated by a tunnel oxide dielectric layer 17, as shown in an elevational cross-section in FIG. 2. The cell of FIG. 1A comprises an inverter with cross-coupled storage (driver) transistors T1 and T2 which serving as a storage flip flop circuit, and a pair of load capacitors C1 and C2 which provide in addition to capacitance, a leakage or tunneling current along with a minimal load resistance, as indicated by the equivalent circuit shown in FIG. 1B, and access (pass/transfer) transistors T3 and T4.

Storage transistors T1 and T2 have their drain regions connected respectively to nodes A1 and A2 and their control gate electrodes cross-coupled respectively via polysilicon gate lines PL1 and PL2 to nodes A2 and A1. Both access transistors T3 and T4 have their control gate electrodes connected to the wordline WL.

As stated above, the SRAM cell of FIG. 1A includes two load capacitors $C_1$ and $C_2$ which replace the resistors R1 and R2 shown in FIG. 4. Load capacitor $C_1$ is connected between a terminal connected to power supply voltage Vcc and via node A1 through a contact DF2 to the drain region of transistor T1 and to the control gate electrode of transistor T2. Load capacitor C2 is connected between power supply voltage Vcc and via node A2 through a contact DF2 to the drain of transistor T2. The source regions of transistors T1 are T2 are connected via node A5 to ground, i.e. reference potential.

Access transistor T3 has its control gate electrode connected to wordline WL and its S/D circuit connected between node A1 and node A4 which is connected to bit line BL. Access transistor T4 has its control gate electrode connected to wordline WL and its S/D circuit connected between node A2 and node A3 which is connected to bit line BL-bar.

The source region of access transistor T3 is connected to node A1. The source region of access transistor T4 is connected to node A2. The current $I_1$ flows from terminal Vcc through load capacitor C1 towards node A1. The current $I_2$ flows from terminal Vcc through load capacitor C2 towards node A2.

FIG. 1B shows the equivalent circuit for the capacitors C1 and C2 which have a capacitor C and a resistor R which carries the leakage current through the capacitor C. The leakage current is a fraction of the current through a conventional resistor having a value of from about $10^7$ ohms to about $10^{13}$ ohms. The capacitor has a capacitance from about 0.01 femtofarads ($10^{-15}$ farads) to about 10 femtofarads ($10^{-15}$ farads).

Figure 3:
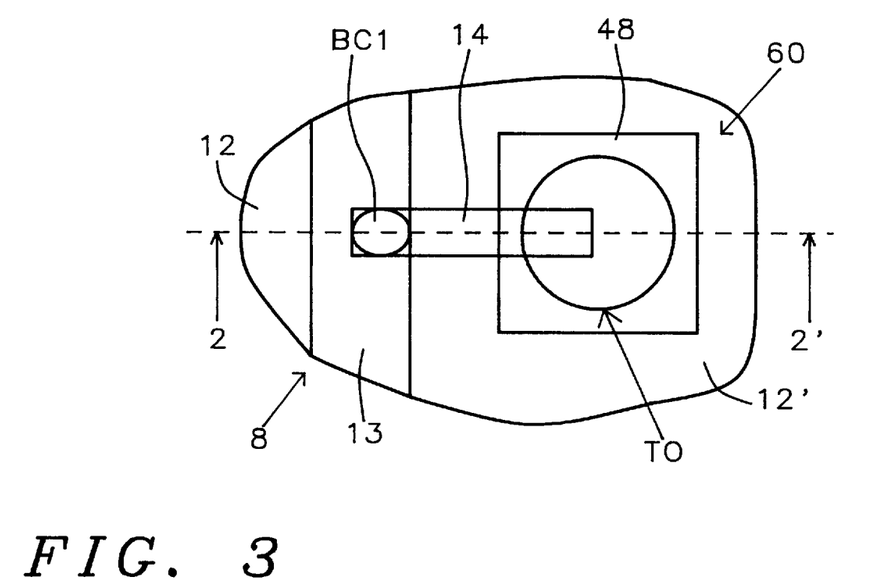
FIG. 3 shows a plan view of the device of FIG. 2.

FIG. 2 shows a sectional view of a portion of an SRAM device 8 in accordance with FIGS. 1A and 1B taken along line 2—2' in FIG. 3. The P− doped substrate 10 has a pair of field oxide (FOX) regions 12 and 12' formed thereon with a buried contact region 13(BC1) therebetween. The buried contact region is counterdoped with N-type dopant with respect to the P− doped substrate 10. A lower plate 21 of a capacitor 60 comprises laminated polysilicon conductor bottom layer 19 and contact layer 14 formed over a portion of the surface of substrate 10 between FOX regions 12 and 12', and extending upon the curved upper surface of the FOX region 12' and extending beyond, partially across the flat surface of FOX region 12'. The contact layer 14 of the lower plate 21 reaches down into electrical and mechanical contact with the surface of region 13.

Above the polysilicon contact layer 14 of the lower plate 21 is formed a tunnel oxide layer 17 composed of silicon dioxide formed by thermal oxidation with a mixture of $N_2/O_2$ at a temperature from about 800° C. to about 900° C. The tunnel oxide layer 17 has a thickness from about 50 Å to about 500 Å.

A second polysilicon conductor 48 has been deposited over the device covering the tunnel oxide layer 17 or has been patterned to extend across (overlap) an edge of the contact layer 14 above the tunnel oxide layer 17 above the flat surface of FOX region 12' split between covering the surface of layer 17 and covering the surface of the field oxide region 12' beyond the tunnel oxide layer 17.

The tunnel oxide layer 17 is thin enough to provide a significant leakage current density J which as described in equations 1 and 2 below, which is an inverse function of $T_{ox}$ (the thickness of the tunnel oxide) and a direct function of the surface area of the overlap between polysilicon contact layer 14 and the polysilicon layer 48 for the capacitor 60.

$$J = AE^2 \exp(-B/E) \qquad \text{<EQ 1>}$$

where

J=current density
E=electrical field across tunnel oxide layer 17

A & B are constants $$E = \frac{V}{T_{ox}} \qquad \text{<EQ 2>}$$

where $T_{ox}$=thickness of tunnel oxide layer 17
V=voltage across tunnel oxide layer 17

Figure 8:
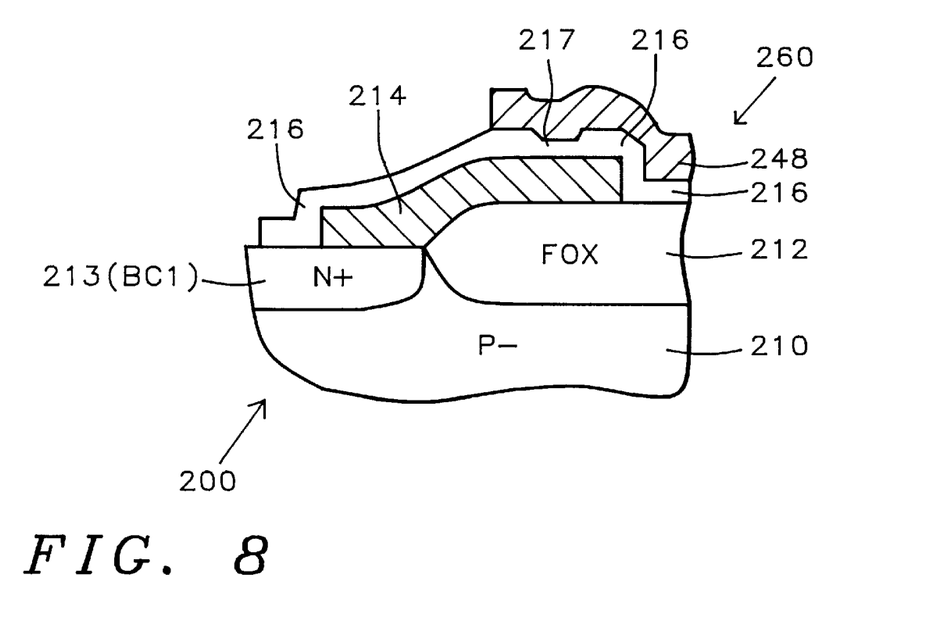
FIG. 8 shows a sectional view of an alternative embodiment to FIG. 2 of a portion of an SRAM device in accordance with FIGS. 1A and 1B.

FIG. 8 shows a sectional view of an alternative embodiment to FIG. 2 of a portion of an SRAM device 200 in accordance with FIGS. 1A and 1B. The P− doped substrate 210 has a field oxide (FOX) region 212 formed thereon with an N+ doped, buried contact region 213 (BC1) formed in substrate 210 adjacent to the FOX region 212. A lower plate 214 (contact layer) of a capacitor 260 comprises a polysilicon conductor formed over FOX region and over a corner of the surface of region 213 adjacent to FOX region 212 extending partially across the flat surface of FOX region 212. In summary, the contact layer 214 is the lower plate of a capacitor 260, and layer 214, which overlies the FOX region 212 reaches down into electrical and mechanical contact with the surface of buried contact region 213.

Above the polysilicon contact layer 214 (lower plate) is formed a tunnel oxide layer 217 having a thickness from about 50 Å to about 500 Å composed of silicon dioxide formed by thermal oxidation with a mixture of $N_2/O_2$ at a temperature from about 800° C. to about 950° C.

A second polysilicon conductor 248 has been deposited over the device covering the tunnel oxide layer 217 and a portion of the gate oxide layer 216 above the flat surface of FOX region 212.

FIG. 3 shows a plan view of the device of FIG. 2 showing the FOX regions 12, and 12' with the buried contact region BC1 between the N+ doped drain region 13 and the portion of the polysilicon contact layer 14 which comprises the lower plate 21 of a capacitor 60 such as capacitors C1 and C2. The upper plate 48 is shown with the tunnel oxide opening area TO.

Referring to FIG. 8, an alternative design of the device of FIG. 2 is shown.

Referring again to FIGS. 1 and 2, the buried contact BC2 is defined by the steps as follows:

1. Deposit a gate oxide layer 16, having a thickness between about 350 Å and about 2,000 Å.
2. Form a photoresist mask over layer 16 patterned to define a window for contact TO.
3. Grow a tunnel oxide layer 17 having a thickness between about 50 Å and about 500 Å by means of a thermal growth process.
54. Deposit polysilicon layer 48 and form a mask to define the shape thereof.

Figure 5:
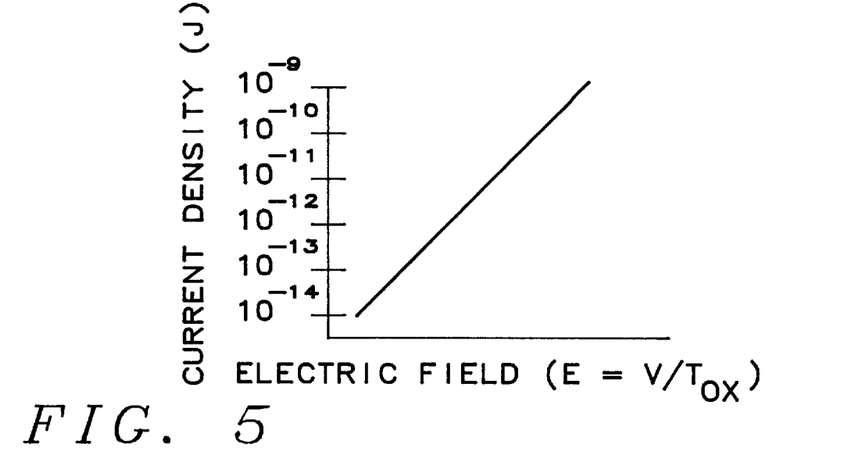
FIG. 5 shows a chart of current density vs. voltage for the tunnel oxide in accordance with this invention.

FIG. 5 shows a chart of current density J vs. voltage V for the tunnel oxide in accordance with this invention.

FIGS. 6A–6H are sectional views of the device of FIG. 2 illustrating the process of forming the device of FIG. 2.

Figure 6A:
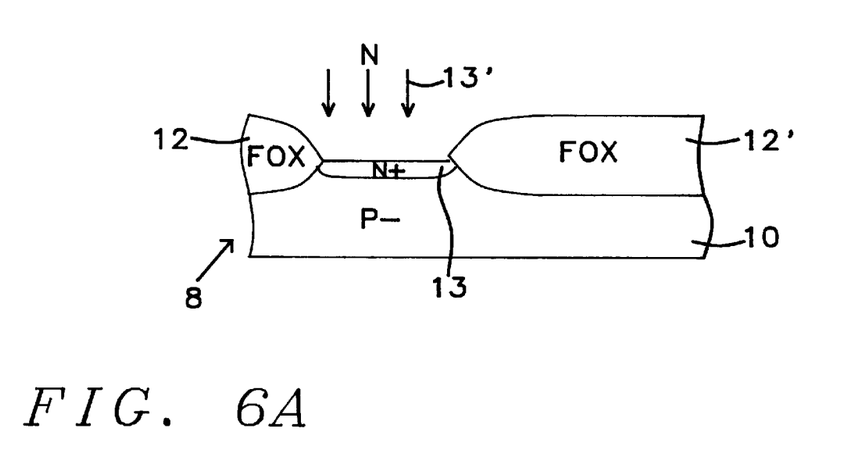
FIGS. 6A–6H are sectional views of the device of FIG. 2 illustrating the process of forming the device of FIG. 2.

In FIG. 6A, the device of FIGS. 2 and 3 is shown in an early stage of manufacture of device 8. At this stage, device 8 includes a P− doped substrate 10 has a pair of field oxide (FOX) regions 12 and 12' formed on the surface thereof, with an N+ doped buried contact region 13 therein. Region 13 is counterdoped with respect to the P-doped substrate 10 with N-type dopant provided by ion implantation with N-type ions 13' such as arsenic or phosphorus dopant with a dose from about $1 \times 10^{13}$ atoms/cm² to about $1 \times 10^{15}$ atoms/cm² at an energy level from about 40 keV to about 150 keV.

Figure 6B:
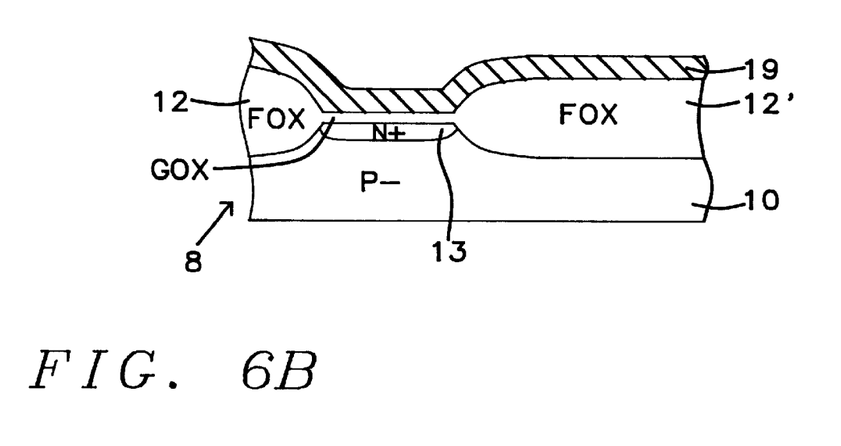

In FIG. 6B, a gate oxide layer GOX has been formed over the exposed surface of P− doped substrate 10 between the field oxide (FOX) regions 12 and 12'. Gate oxide layer GOX is formed by depositing a gate oxide layer having a thickness between about 50 Å and about 200 Å over the surface of substrate 10.

Next, a bottom, doped polysilicon layer 19 (part of the laminated lower capacitor plate 21) has been formed over the gate oxide layer GOX and the exposed surfaces of the field oxide (FOX) regions 12 and 12'. Bottom layer 19 has a thickness between about 400 Å and about 4000 Å.

Figure 6C:
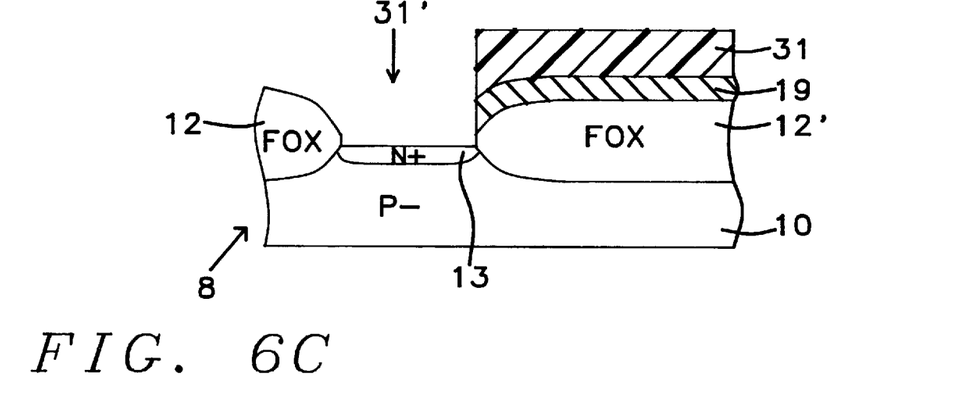

Referring to FIG. 6C, a buried contact photoresist mask 31 has been formed over bottom layer 19 patterned to define a BC1 mask 31 with an opening 31' above the gate oxide region between the FOX regions 12, 12', but covering the portion of bottom layer 19 above FOX region 12'.

Next, using the BC1 mask 31, polysilicon bottom layer 19 and gate oxide layer GOX are etched away over FOX region 12 and between FOX regions 12, 12'. Then mask 31 is stripped from device 8.

Figure 6D:
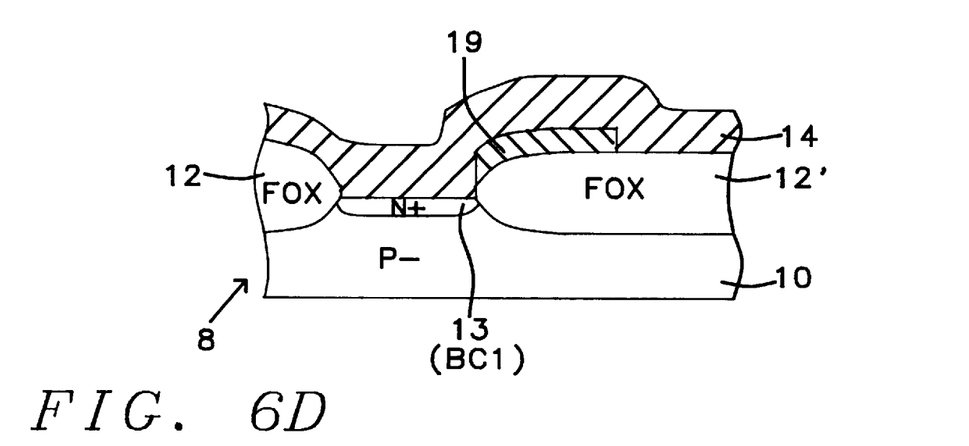

Referring to FIG. 6D, the doped polysilicon contact layer 14 of the lower capacitor plate 21 has been deposited in a blanket deposition having a thickness between about 1000 Å and about 4000 Å. Contact layer 14 reaches down into contact with buried contact layer 13 (BC1) and covers bottom layer 19 and FOX region 12' beyond bottom layer 19.

The contact layer 14 is in direct electrical and mechanical contact with the N+ doped buried contact region 13 forming an electrical contact therewith. The contact layer 14 is covered with a photoresist mask 15 which covers the area where the lower plate 21 of the capacitor 60 is to be formed.

Figure 6E:
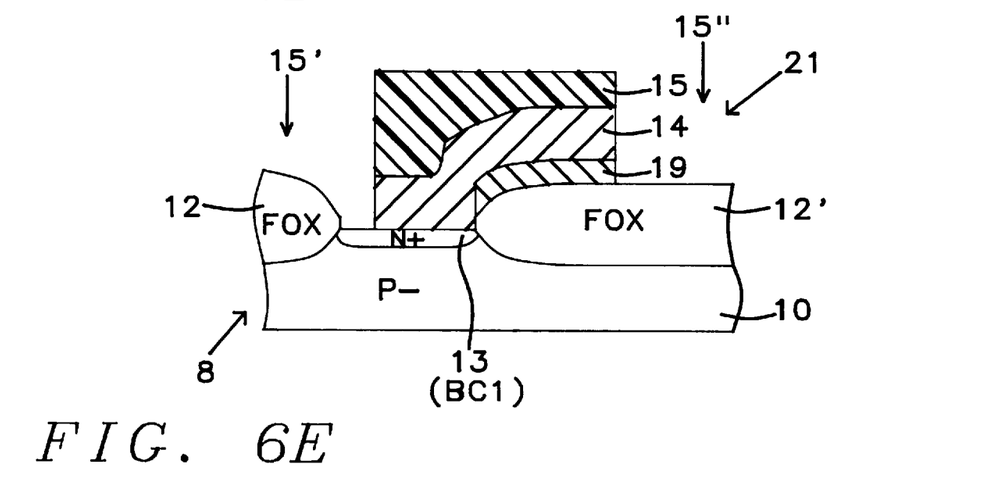

Then, referring to FIG. 6E, a mask 15 for shaping the lower capacitor plate 21 is formed over the contact layer 14. Mask 15 has a first opening 15' over FOX region 12 and the surface of buried contact region 13 which is to be exposed. The mask 15 has an opening 15" over the portion of FOX region 12' which is to be exposed.

Using the mask 15, the lower plate 21 of the capacitor 60 has been patterned by etching away the unwanted portions of contact layer 14 and layer 15 below the openings 15' and 15". Then the mask 15 is stripped away thereafter.

Figure 6F:
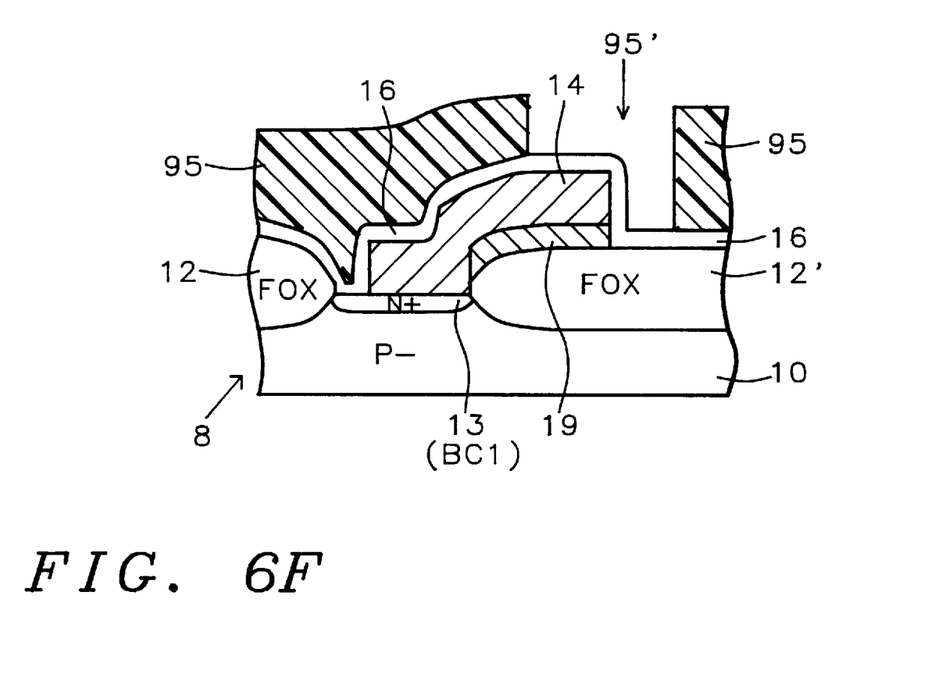
Figure 6G:
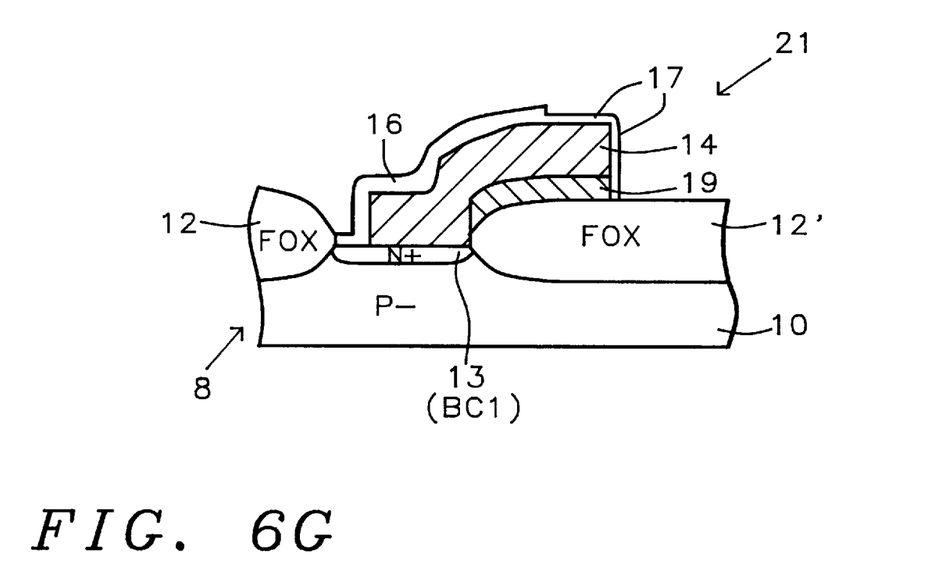

Referring to FIG. 6F, the device 8 of FIG. 6E is shown after a layer of oxide 16 having a thickness between about 350 Å and about 2,000 Å, was formed. Then a photoresist mask 95 was formed over FOX region 12' and over the end of the upper surface of layer 14 leaving the remainder of layer 14 exposed with an opening 95' over contact layer 14. Opening 95' frames the pattern of the window TO over the exposed portion of contact layer 14. The surface of layer 16 exposed through opening 95' in mask 95 will then be etched away down to contact layer 14 and FOX region 12' by diluted hydrogen fluoride (HF) chemical solution as can be seen in FIG. 6G. Then, when mask 95 is stripped away from device 8 the window TO remains leaving the right end of contact layer 14 and bottom layer 19 exposed as well as the upper surface of FOX region 12' on the right end of device 8.

As shown in FIG. 6G, in a process of thermal oxidation, a tunnel oxide layer 17 has been formed in window TO covering the exposed surfaces of doped first polysilicon contact layer 14 including the sidewall over FOX region 12' exposed by the previous etching step in FIG. 6E, and the exposed surface of the field oxide region 12'. The thermal oxidation is performed with a mixture of $N_2/O_2$ at a temperature from about 800° C. to about 900° C. The tunnel oxide layer 17 has a thickness from about 50 Å to about 500 Å.

Figure 6H:
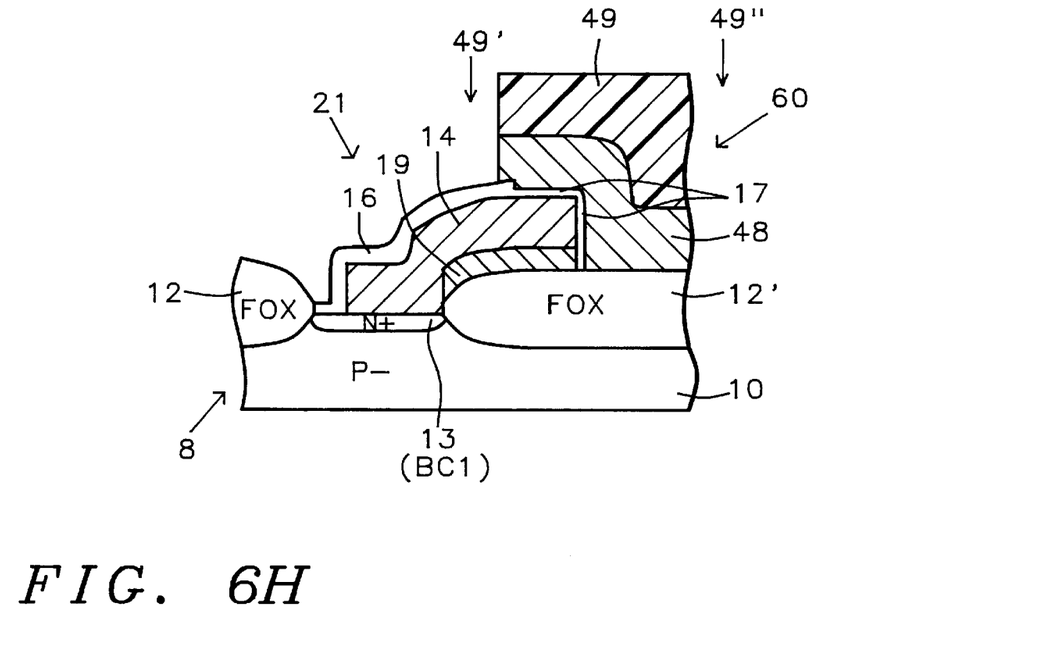

Referring to FIG. 6H, the upper plate of the capacitor 60 was formed by blanket deposition of a doped, second polysilicon layer 48, which has been partially etched away. After upper plate layer 48 was formed by the blanket deposition over the product of FIG. 6G covering the exposed surfaces of FOX regions 12, 12' and covering the tunnel oxide layer 17, etc. a photoresist mask 49 was formed, as shown in FIG. 6H, covering the portion of the layer 48 which is to be employed as the upper plate of the capacitor 60 of FIG. 2.

As shown in FIG. 6H the device 10 is shown after the step of etching away the portions of upper plate layer 48 unprotected by the mask 49 to pattern the upper plate 48 of the capacitor 60.

FIG. 2 shows the finished device of FIG. 6H after stripping away the mask 49.

FIGS. 7A–7H are sectional views of a fragment of a device 100, similar to the device of FIG. 2, illustrating an alternative process of forming a device 100 in accordance with this invention in connection with other elements of the SRAM device of FIG. 1.

Figure 7A:
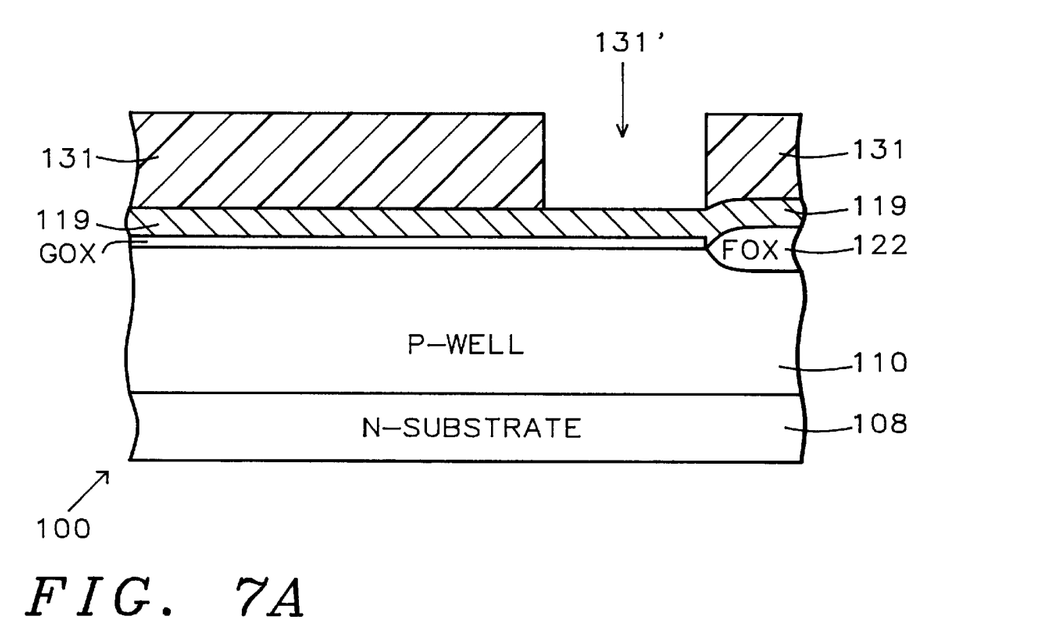
FIGS. 7A–7H are sectional views of a fragment of a device, similar to the device of FIG. 2, illustrating an alternative process of forming a device in accordance with this invention in connection with other elements of the SRAM device of FIG. 1.

In FIG. 7A, device 100 is shown in an early stage of manufacture. Device 100 includes an N− doped substrate 100 in which a P− doped well 110 has been formed. In a portion of the well 110, a conventional field oxide (FOX) region 122 is formed extending above the surface of P−doped well 10 and down within the well 110. Above the remainder of the surface of the P-well 110 aside from the FOX region 122 is formed a gate oxide layer GOX comprising a silicon oxide layer having a thickness between about 50 Å and about 200 Å.

Next, a blanket, doped, polysilicon bottom layer 119, which is part of the laminated lower capacitor plate 121, has been formed over gate oxide layer GOX and over the surface of FOX region 122. Bottom layer 119 has a thickness between about 400 Å and about 4000 Å.

Next, a mask 131 for buried contact BC1 is formed over layer 119 with a buried contact window opening 131' extending therethrough above the location where the buried contact region 134 (BC1) is to be formed in well 110.

Figure 7B:
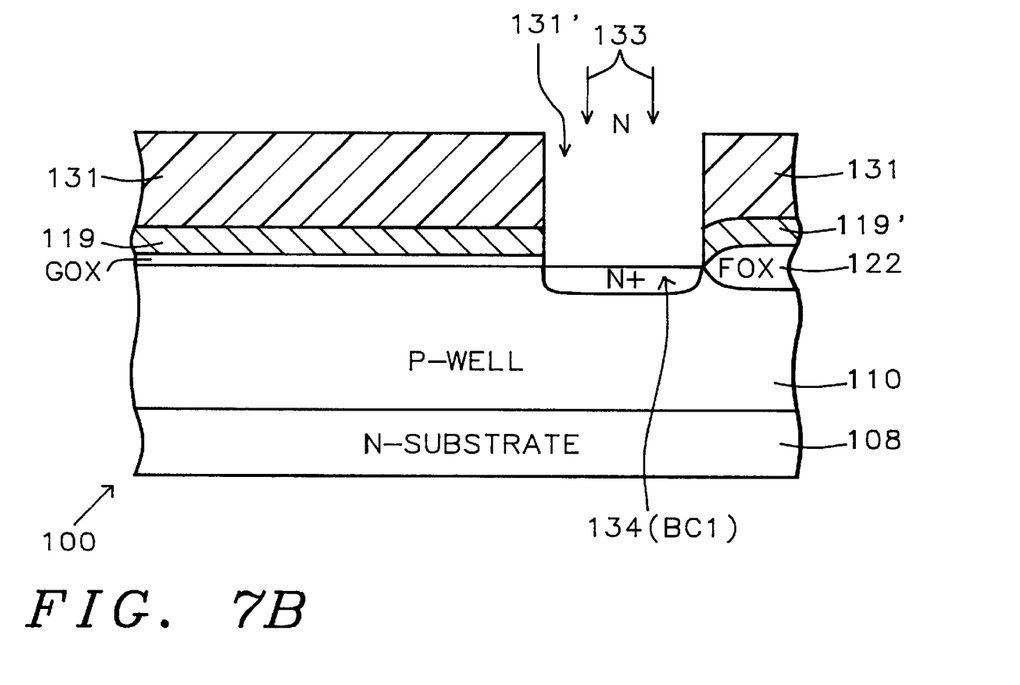

In FIG. 7B, the product of FIG. 7A is shown with window 131' located to the left of the FOX region 122 in the mask 131. Using the mask 131, the polysilicon layer 119 is etched away below the window opening 131' using a conventional anisotropic etching process. The gate oxide layer GOX is also etched away through the opening window 131' in a conventional anisotropic etching process extending the window 131' down to the surface of P-well 110. The layer 119 has been modified to the extent that layer 119 to the left of window 131' remains in place for use in formation of a control gate electrode (as shown in FIG. 7D) and the lower layer 119' of a lower plate 121 (as seen in FIG. 7D) of a capacitor 160 being formed (as seen in FIGS. 7G and 7H), which overlies the FOX region 122.

In the next step, using mask 131, N-type ions 133 are ion implanted to form counterdoped N+ region 134 (BC1) in P-well 110. The ions 133 pass through the buried contact window opening 131' to form an N+ doped buried contact region 134 (BC1) adjacent to FOX region 122. The ions 133 are implanted with N-type dopant such as arsenic or phosphorus with a dose from about $1\times10^{13}$ atoms/cm$^2$ to about $1\times10^{16}$ atoms/cm$^2$ at an energy level from about 40 keV to about 150 keV.

Figure 7C:
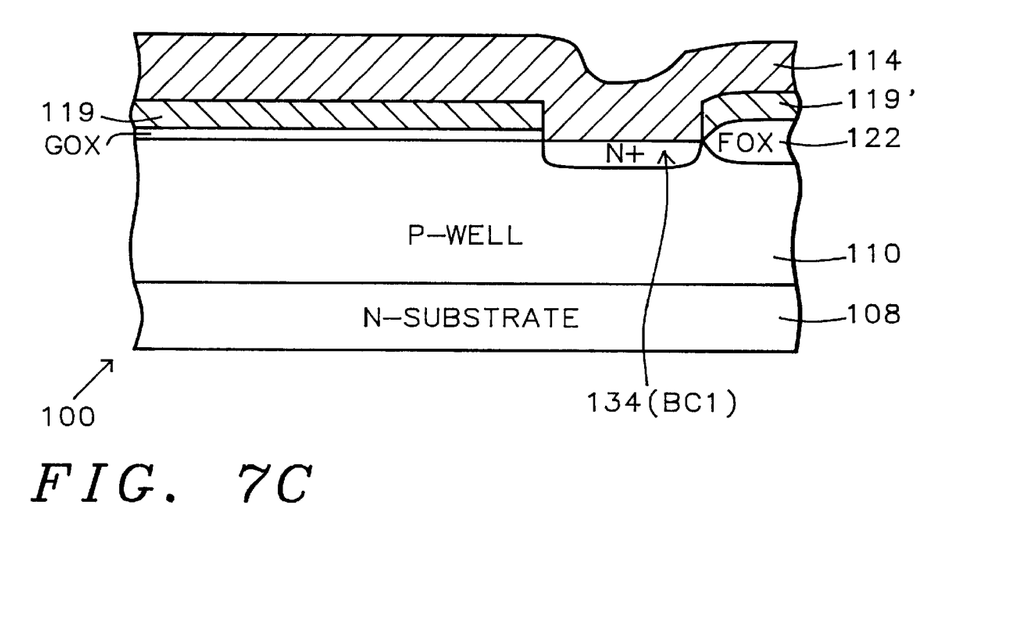
Figure 7D:
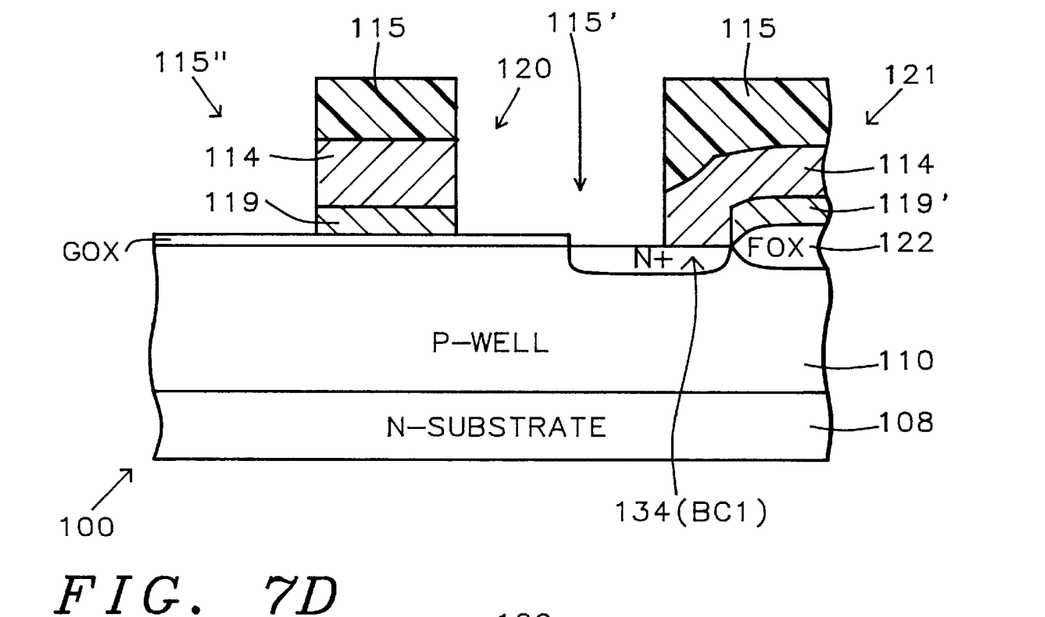

FIG. 7C shows the product of FIG. 7B after the mask 131 was stripped from device 100, leaving the lower portion 119 of the control electrode 120 and the lower portion 119' of capacitor plate 121 exposed, as well as the surface of buried contact region 134 (BC1).

Next, a polysilicon contact layer 114 (which is the upper portion of the lower capacitor plate 121) was deposited in a blanket deposition having a thickness between about 1000 Å and about 4000 Å. Contact layer 114 reaches down between layer 119 and bottom layer 119' through window 134' into contact with buried contact region 134 (BC1) and covers bottom gate electrode layer 119 to the left of buried contact region 134, as well bottom layer 119' and FOX region 122 beyond bottom layer 119' over the buried contact region 134.

Referring to FIG. 7D, the contact layer 114 was then covered with a photoresist mask 115 which was patterned with openings 115' and 115" therethrough. Mask 115 covers the areas which are to be formed into the lower plate 121 of a capacitor 160 and the control gate electrode 120 for a transistor to be formed subsequently, as well as the contact layer 114' of the lower plate 121 of a capacitor 160 of the kind shown in FIG. 2. Control gate electrode 120 (formed of layers 114 and 119) and bottom plate 121 (formed of layers 119' and 114') have been formed by etching away the unwanted portions of the contact layer 114 and bottom layer 119 leaving portions thereof (upper gate layer 114 and contact layer 114') beneath the mask 115 between the center of buried contact region 134 and to the right of gate electrode 120, and the gate electrode well to the left of buried contact region 134. Window 115' is formed over the left side of the contact layer 114' and to the right of the gate electrode 120. Window 115" is formed to the left side of the gate electrode 120. Thus the gate electrode 120 (upper gate layer 114) remains over gate oxide layer GOX. The contact layer 114' of the lower plate 121 is in direct electrical contact with the buried contact region 134 (BC1). In addition layers 119' and 114' extend up the surface of FOX region 122 onto a portion of the flat upper surface of FOX region 122.

Figure 7E:
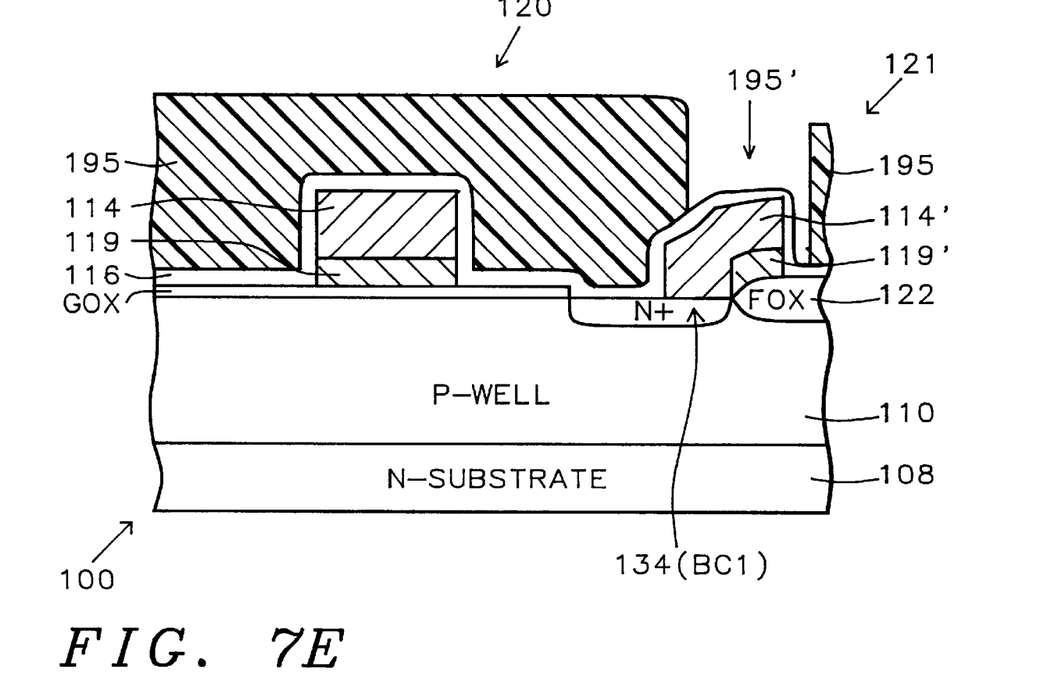

FIG. 7E shows the product of FIG. 7D after the mask 115 has been stripped from device 100. A layer of silicon dioxide 116 having a thickness from above 350 Å and about 2,000 Å has been formed.

Then a photoresist mask 195 has been formed over silicon dioxide layer 116. Mask 195 is above a portion of FOX region 122, the gate oxide layer GOX, upper gate layer 114 and a portion of the left end of contact layer 114', leaving the remainder of layer 116 above the upper surface of contact layer 114' exposed with an opening 195' located there, above layer 116, over contact layer 114'. An opening 195' in mask 195 extends over a portion of buried contact 134 (BC1) and a portion of FOX region 122. The exposed portion of silicon dioxide layer 116 below opening 195' is etched off by a diluted hydrogen fluoride (HF) solution as can be seen by reference to FIG. 7F where layer 116 has been removed by etching.

Figure 7F:
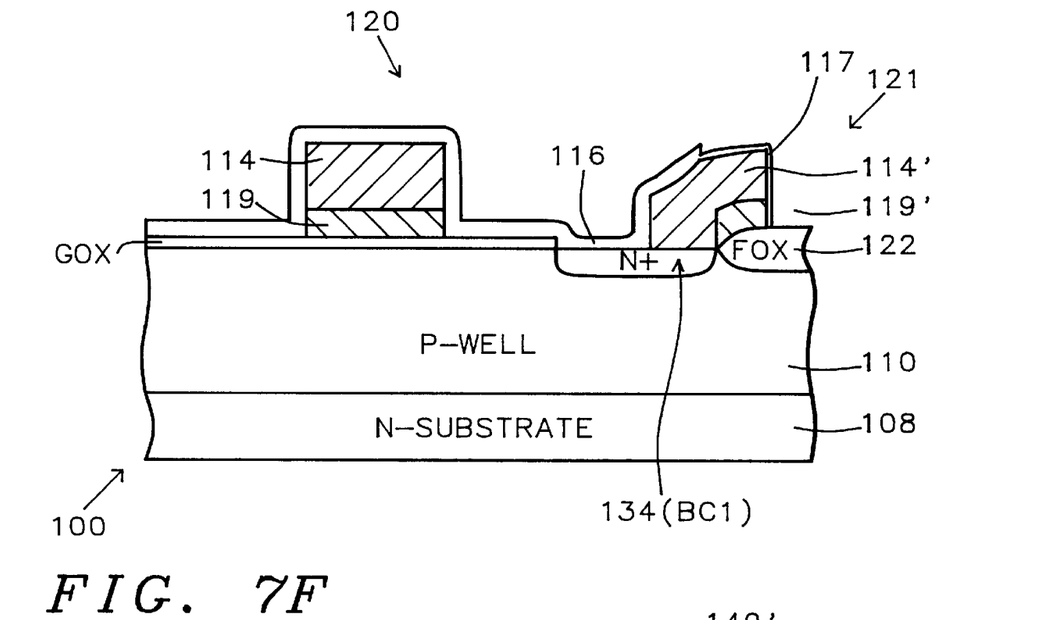
Figure 7G:
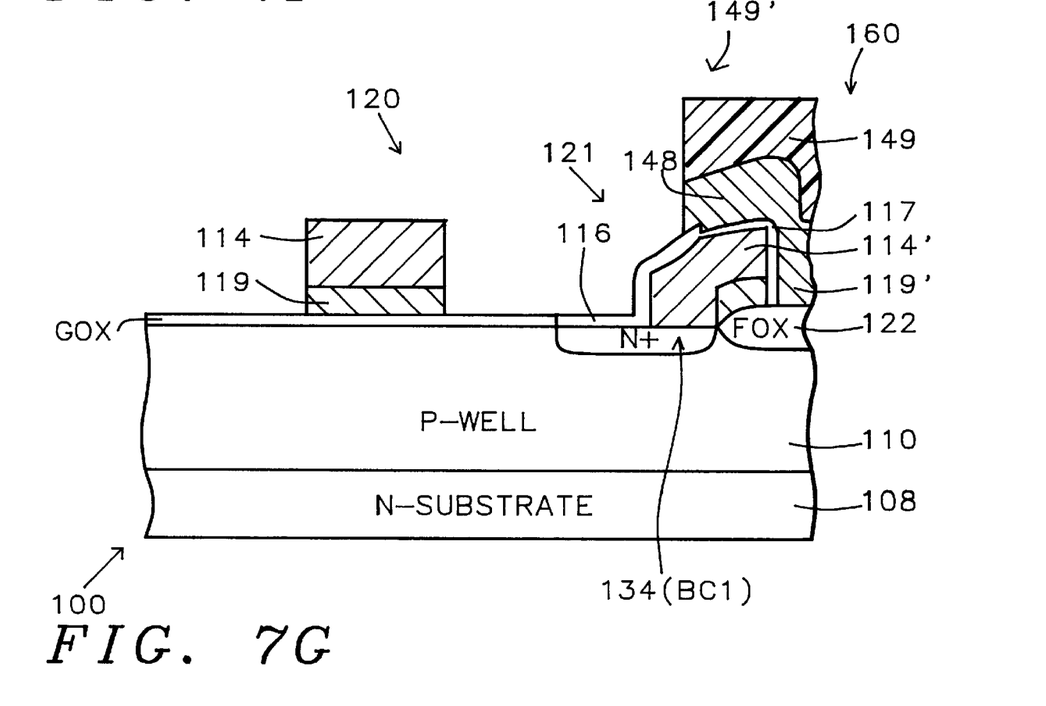
Figure 7H:
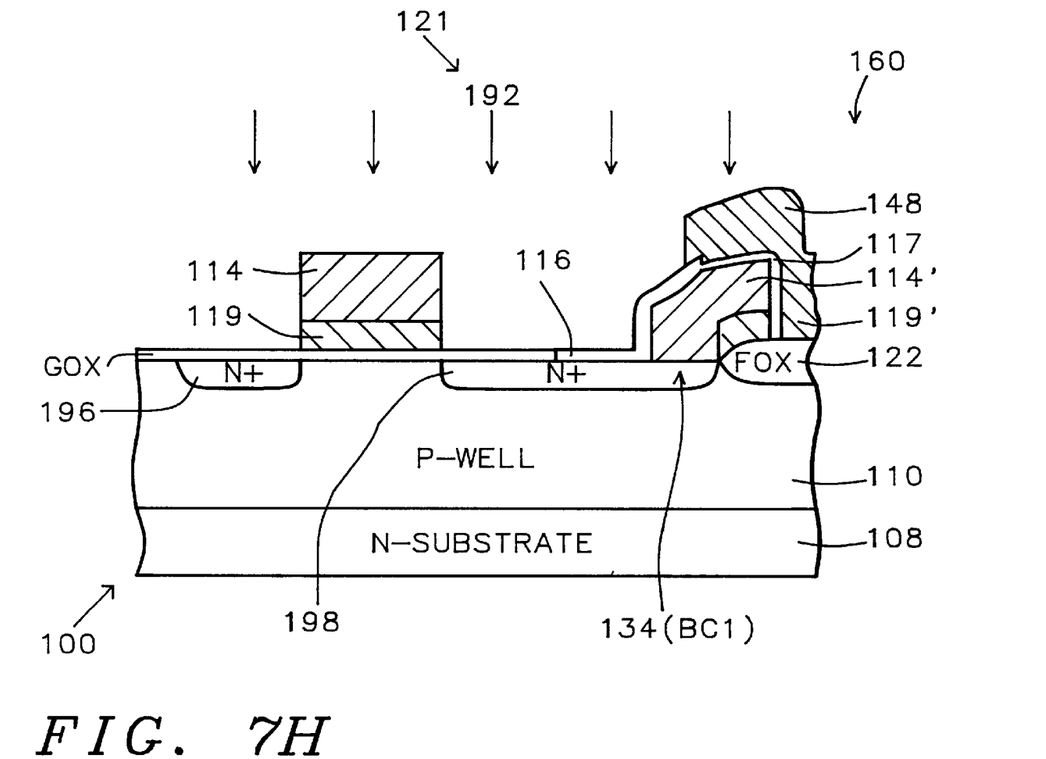

FIG. 7F shows the product of FIG. 7E after the mask 195 has been stripped therefrom. The next step is that the exposed surface of contact layer 114' and layer 119' of the lower capacitor plate 121 are coated with a tunnel oxide layer 117 which is formed by thermal oxidation as explained above in connection with FIG. 6G.

Referring to FIG. 7G, a second polysilicon layer 148 was deposited in a blanket deposition over the device 100. Then a mask 149 was formed over the layer 148 to form the upper electrode plate 148 of the capacitor 160 being deposited over the exposed portions of tunnel oxide layer 117 by etching away the unwanted remaining portions of layer 148.

FIG. 7H shows the product of FIG. 7G after the mask 149 has been stripped from the device and shows the completed capacitor 160 formed by lower plate 121 (layers 114'/119') tunnel oxide layer 117 and the upper plate layer 148 of capacitor 160.

Then, N-type ions 192 are implanted into regions 196/198 self-aligned with the control gate electrode 114/119 to form source/drain regions 196/198 in P-well 110. The source/drain regions 196/198 are electrically connected through well 110 via the buried contact 134(BC1) to the lower plate 121 of the capacitor 160.

FIGS. 9A–9D are sectional views of the device 200 of FIG. 8 illustrating the process of forming the device 200.

Figure 9A:
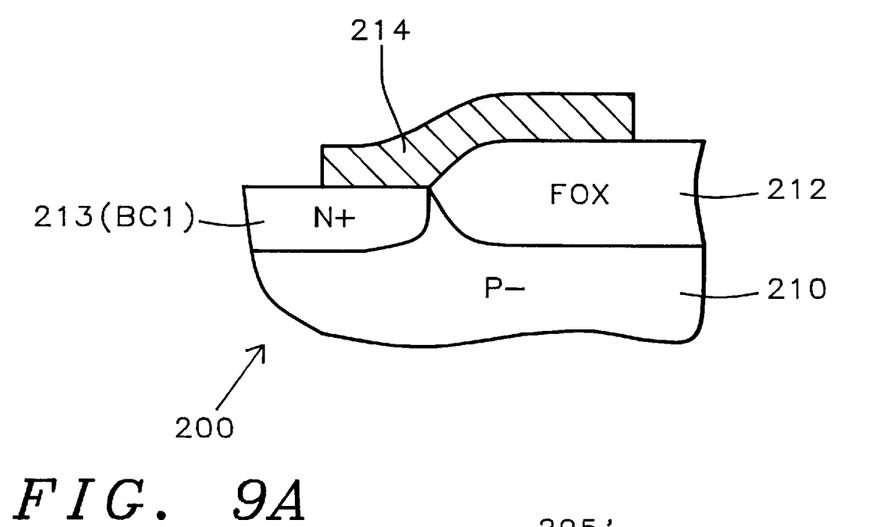
FIGS. 9A–9D are sectional views of the device of FIG. 8 illustrating the process of forming the device.

In FIG. 9A, the device of FIG. 8 is shown in a later stage of manufacture of device 200 since the earlier steps will be understood by the descriptions of the earlier embodiments. At this stage, device 200 includes a P– doped substrate 210 has a field oxide (FOX) region 212 formed on the surface thereof, with an N+ doped buried contact region 213 (BC1) therein. Region 213 was counterdoped with respect to the P-doped substrate 210 with N-type dopant provided by ion implantation with N-type ions such as arsenic or phosphorus dopant with a dose from about $1\times10^{18}$ atoms/cm$^2$ to about $1\times10^{21}$ atoms/cm$^2$ at an energy level from about 40 keV and about 150 keV.

A doped polysilicon lower plate (contact layer) 214, which comprises the lower capacitor plate, was deposited in a blanket deposition having a thickness between about 1000 Å and about 4000 Å and then etched to the pattern shown. At one end, lower plate 214 reaches down into contact with the buried contact layer 213 (BC1) and covers FOX region 212.

The lower plate (contact layer) 214 is in direct electrical and mechanical contact with the N+ doped buried contact region 213 forming an electrical contact therewith. The lower plate 214 of the capacitor 260 has been patterned by etching away the unwanted portions of contact layer 214 as will be understood by the descriptions above of other embodiments.

Figure 9B:
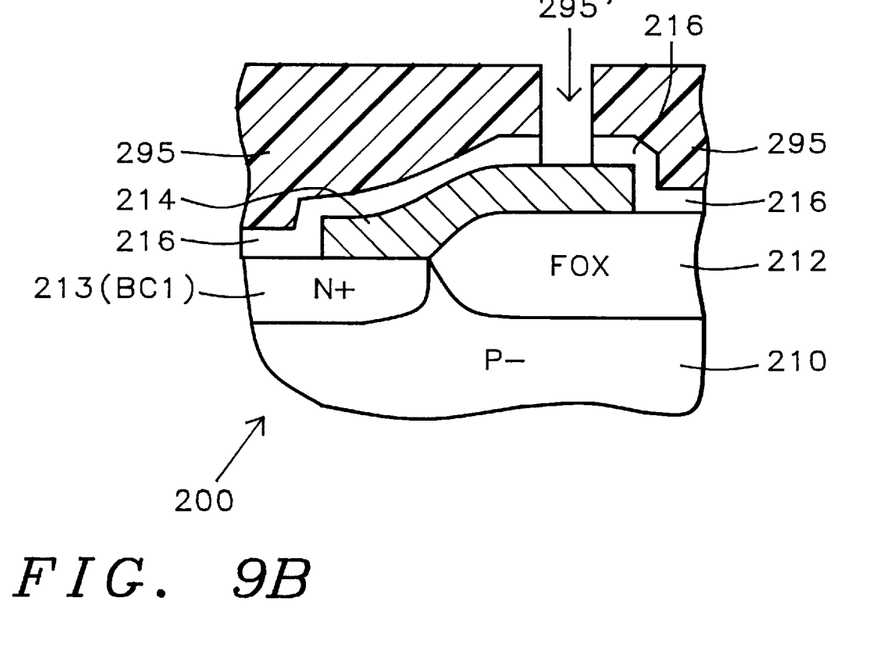

Referring to FIG. 9B, then a silicon dioxide layer 216, having a thickness between about 350 Å and about 2,000 Å, is formed over the exposed surface of lower plate 214.

Next, the device 200 of FIG. 9A has a photoresist mask 295 formed over the whole surface of device 200 except for a window 295' formed over a portion surface of layer 216 above the upper surface of layer 214. The silicon dioxide layer 216 below window 295' is then etched off by a diluted aqueous solution of hydrogen fluoride (HF) chemical. Then Then, mask 295 is stripped off.

Figure 9C:
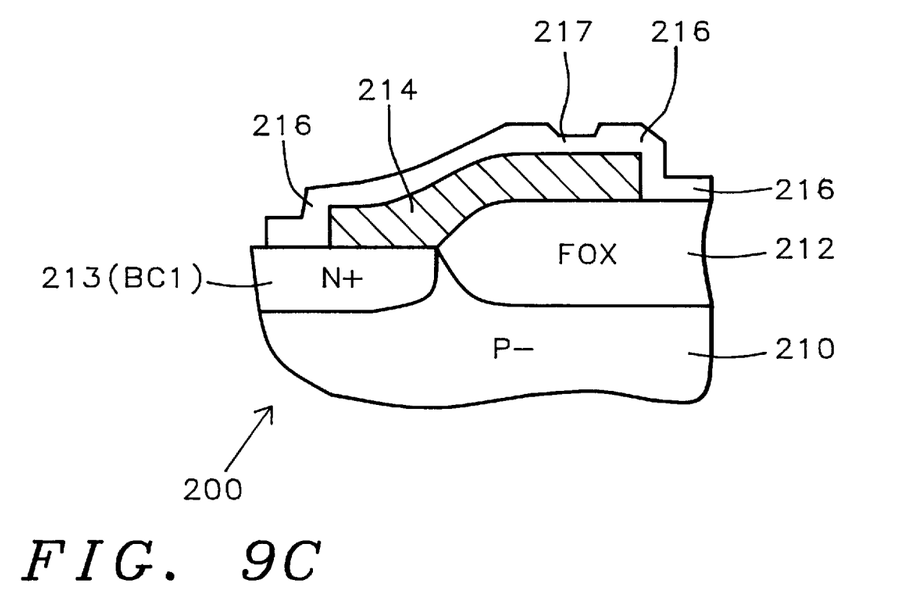

Then, as shown in FIG. 9C, following the stripping of mask 295, a process of thermal oxidation follows in which a thinner tunnel oxide layer 217 having a thickness from about 50 Å to about 500 Å has been formed in the tunnel oxide window covering the exposed surfaces of doped first polysilicon contact layer 214. The thermal oxidation is performed with a mixture of $N_2/O_2$ at a temperature from about 800° C. to about 900° C.

Figure 9D:
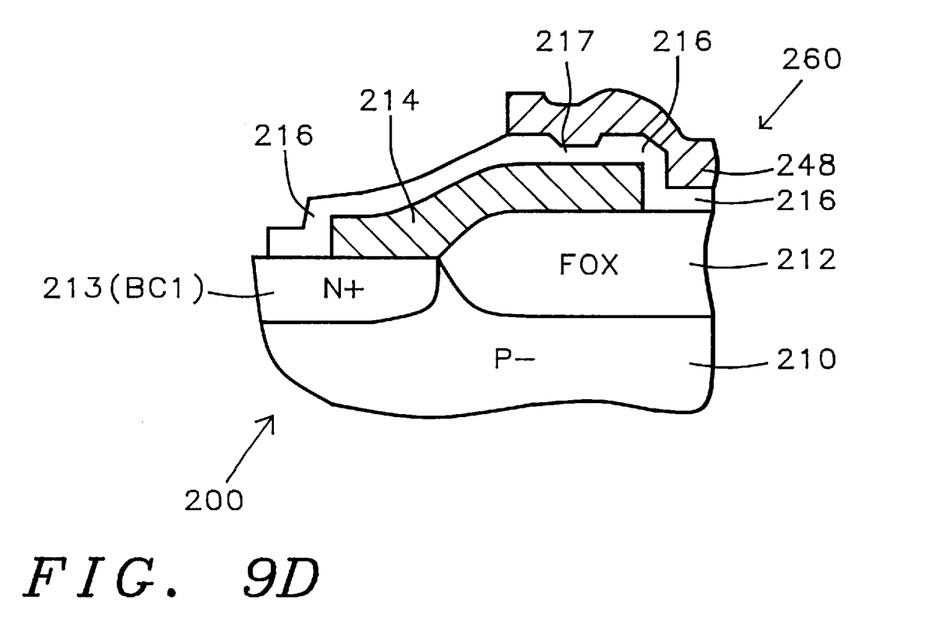

Referring to FIG. 9D, the upper plate 248 of the capacitor 260 was formed by blanket deposition of a doped, second polysilicon layer 248, which has been partially etched away. After upper plate layer 248 was formed by the blanket deposition over the product of FIG. 9G covering the exposed surfaces of FOX regions 212, and covering the tunnel oxide layer 217, etc. a photoresist mask was formed, (not shown), covering the portion of the layer 248 which is to be employed as the upper plate of the capacitor 260. The mask was used for etching away the portions of upper plate layer to pattern it into the upper plate 248 of the capacitor 260, as shown.

SUMMARY

The advantages of the present invention are as follows:
1. Smaller contact resistance at A1 and A2 (FIG. I) connection points.

2. Easier control range for I1 and I2.

3. Smaller cell size.

Features of this invention are as follows:

1. Two capacitors C1 and C2 replace the conventional R1 and R2 (FIG. 4) resistors.
2. The currents I1 and I2 through capacitors C1 and C2 are the tunneling leakage current (or the tunneling current) through the capacitors C1 and C2.
3. The connections A1 and A2 are as follows:
    A. polysilicon gate lines PL1 and PL2 make connections with diffusion areas of transistors through buried contacts DF1 and DF2.
    B. Capacitors C1 and C2 are formed on polysilicon gate lines PL1 and PL2.
4. The only difference from conventional fabrication processes is the addition of a step of thermal oxidation, which greatly enhances the value of the product with minimal manufacturing cost.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An SRAM transistor cell on a doped semiconductor substrate comprising:
    a first access transistor and a second access transistor, each having a source region, a drain region and a control gate electrode,
    a first storage transistor and a second storage transistor each having a source region, a drain region and a control gate electrode,
    a first node and a second node,
    a first load capacitor having a first lower plate, a first upper plate and a first tunnel oxide layer, said lower plate connected to said first node and said first upper plate connected to said power supply connection,
    said first tunnel oxide layer covering at least a portion of said first lower plate and said first upper plate being formed above said first tunnel oxide layer,
    a second load capacitor having a second lower plate, a second upper plate and a second tunnel oxide layer, said second upper plate connected to said second node and said second lower plate connected to said power supply connection,
    said second tunnel oxide layer covering at least a portion of said second lower plate and said second upper plate being formed above said second tunnel oxide layer,
    a bit line and a bit line bar,
    first and second interconnection lines,
    said first storage transistor having the drain region thereof connected to said first node,
    said second storage transistor having the drain region thereof connected to said second node,
    said first and second storage transistors having the source regions thereof connected together,
    said first node cross connected via said first interconnection line to the control gate electrode of said second transistor,
    said second node cross connected via said second interconnection line to the control gate electrode of said first transistor,
    said control gate electrodes of said first and second access transistors being connected to a wordline,
    said drain region of said first access transistor being connected to said first node,
    said drain region of said second access transistor being connected to said second node,
    said source region of said first access transistor being connected to said bit line, and
    said source region of said second access transistor being connected to said bit line bar.

2. An SRAM transistor cell in accordance with claim 1 wherein said first and second nodes are connected to said drain regions respectively of said storage transistors in said substrate.

3. An SRAM transistor cell in accordance with claim 2 wherein said first and second lower capacitor plates are connected to said drain regions respectively.

4. An SRAM transistor cell in accordance with claim 3 wherein said first and second lower capacitor plates are covered by a tunnel oxide layer.

5. An SRAM transistor cell in accordance with claim 3 wherein
    said first and second lower capacitor plates are covered respectively by said first and second tunnel oxide layers, and
    said tunnel oxide layers are covered by said upper capacitor plates.

6. An SRAM transistor cell in accordance with claim 3 wherein
    said cell is formed over doped silicon,
    field oxide regions are formed on said doped silicon,
    said lower capacitor plates are formed above said field oxide regions.

7. An SRAM transistor cell on a doped semiconductor substrate comprising:
    a first access transistor and a second access transistor, each having a source region, a drain region and a control gate electrode,
    a first storage transistor and a second storage transistor each having a source region, a drain region and a control gate electrode,
    a first node and a second node,
    a first load capacitor having one plate connected to said first node and the other plate thereof connected to said power supply connection,
    a second load capacitor having one plate connected to said second node and the other plate thereof connected to said power supply connection,
    a bit line and a bit line bar,
    first and second interconnection lines,
    said first storage transistor having the drain region thereof connected to said first node,
    said second storage transistor having the drain region thereof connected to said second node,
    said first and second storage transistors having the source regions thereof connected together,
    said first node cross connected via said first interconnection line to the control gate electrode of said second transistor,
    said second node cross connected via said second interconnection line to the control gate electrode of said first transistor, said control gate electrodes of said first and second access transistors being connected to a wordline, said drain region of said first access transistor being connected to said first node, said drain region of said second access transistor being connected to said second node, said source region of said first access transistor being connected to said bit line, and said source region of said second access transistor being connected to said bit line bar, said first second nodes are connected to said drain regions respectively of said storage transistors in said substrate, said lower capacitor plates are connected to said drain regions respectively, said cell is formed over doped silicon, a field oxide region is formed on said doped silicon, said lower capacitor plate is formed above said field oxide region, said lower plate of said capacitor has an edge formed over said field oxide region, said tunnel oxide layer covering at least a portion of said lower plate, and said upper plate of said capacitor being formed above said tunnel oxide layer.

8. An SRAM transistor cell on a doped semiconductor substrate comprising:

a first access transistor and a second access transistor, each having a source region, a drain region and a control gate electrode, a first storage transistor and a second storage transistor each having a source region, a drain region and a control gate electrode, a first node and a second node, a first load capacitor having one plate connected to said first node and the other plate thereof connected to said power supply connection, a second load capacitor having one plate connected to said second node and the other plate thereof connected to said power supply connection, a bit line and a bit line bar, first and second interconnection lines, said first storage transistor having the drain region thereof connected to said first node, said second storage transistor having the drain region thereof connected to said second node, said first and second storage transistors having the source regions thereof connected together, said first node cross connected via said first interconnection line to the control gate electrode of said second transistor, said second node cross connected via said second interconnection line to the control gate electrode of said first transistor, said control gate electrodes of said first and second access transistors being connected to a wordline, said drain region of said first access transistor being connected to said first node, said drain region of said second access transistor being connected to said second node, said source region of said first access transistor being connected to said bit line, and said source region of said second access transistor being connected to said bit line bar, said first second nodes are connected to said drain regions respectively of said storage transistors in said substrate, said lower capacitor plates are connected to said drain regions respectively, said cell is formed over doped silicon, a field oxide region is formed on said doped silicon, said lower capacitor plate is formed above said field oxide region, said lower plate of said capacitors has an edge formed over said field oxide region, said tunnel oxide layer covering at least a portion of said lower plate including said edge, and said upper plate of said capacitor is formed above said tunnel oxide layer and extending across said edge.

9. An SRAM transistor cell in accordance with claim 8 wherein:

said cell is formed over doped silicon, a field oxide region is formed on said doped silicon, said lower capacitor plate of said capacitor is formed partially above said field oxide region and partially in contact with said doped silicon.

10. An SRAM transistor cell in accordance with claim 9 wherein:

said lower plate of said capacitor has an edge formed over said field oxide region, said tunnel oxide layer covering at least a portion of said lower plate, and said upper plate of said capacitor being formed above said tunnel oxide layer.

11. An SRAM transistor cell in accordance with claim 9 wherein:

said lower plate of said capacitors has an edge formed over said field oxide region, said tunnel oxide layer covering said edge, and said upper plates of said capacitors are formed above said tunnel oxide layers and extend across said edges.

12. An SRAM transistor cell in accordance with claim 9 wherein:

said lower plate of said capacitors has an edge formed over said field oxide region, said tunnel oxide layer covering said edge, and said upper plates of said capacitors are formed above said tunnel oxide layers and extend across said edges.

13. An SRAM transistor cell in accordance with claim 10 wherein said lower capacitor plates are formed partially above a field oxide region formed on doped silicon.

14. An SRAM transistor cell in accordance with claim 13 wherein:

said lower plate of of each of said capacitors has an edge formed over a said field oxide region, said tunnel oxide layer covering said edge, and said upper plates of said capacitors are formed above said tunnel oxide layers and extend across said edges.

15. An SRAM transistor cell in accordance with claim 8 wherein said capacitors are formed on said interconnection lines.

* * * * *